United States Patent [19]

Higgins et al.

[11] Patent Number: 4,546,343

[45] Date of Patent: Oct. 8, 1985

[54] DATA ACQUISITION CHANNEL APPARATUS

[75] Inventors: Charles H. Higgins; John D. Skipper, both of Albuquerque, N. Mex.

[73] Assignee: The United States of America as represented by the Secretary of the Air Force, Washington, D.C.

[21] Appl. No.: 627,691

[22] Filed: Jul. 3, 1984

[51] Int. Cl.[4] .............................................. H03K 13/02
[52] U.S. Cl. ...................... 340/347 AD; 340/347 SH; 324/115; 330/254
[58] Field of Search ................................. 330/254, 69; 340/347 AD, 347 CC, 347 NT, 347 C, 347 SH; 324/115, 116, 99 D

[56] References Cited

U.S. PATENT DOCUMENTS

| | | | |
|---|---|---|---|
| 3,696,403 | 10/1972 | Di Rocco | 340/347 NT |
| 3,732,376 | 5/1983 | Chatelon | 179/15 BY |
| 3,982,241 | 9/1976 | Lipcon | 340/347 CC |
| 4,125,831 | 11/1978 | Mazur et al. | 340/347 AD |
| 4,282,515 | 8/1981 | Patterson, III | 340/347 CC |
| 4,380,757 | 4/1983 | Vancsa | 340/347 CC |
| 4,514,702 | 4/1985 | Zogg | 330/254 |

Primary Examiner—Charles D. Miller
Attorney, Agent, or Firm—Donald J. Singer; Gerald B. Hollins

[57] ABSTRACT

A hybrid integrated circuit data acquisition channel apparatus employing an operational amplifier fed by a low current differential bipolar transistor preamplifier having separate feedback gain and signal gain determining elements and providing an amplified signal output to a sample and hold and analog-to-digital converter circuits. The disclosed apparatus operates with low energy and small space requirements and is capable of operation without the sample and hold circuit where the nature of the applied input signal permits.

14 Claims, 1 Drawing Figure

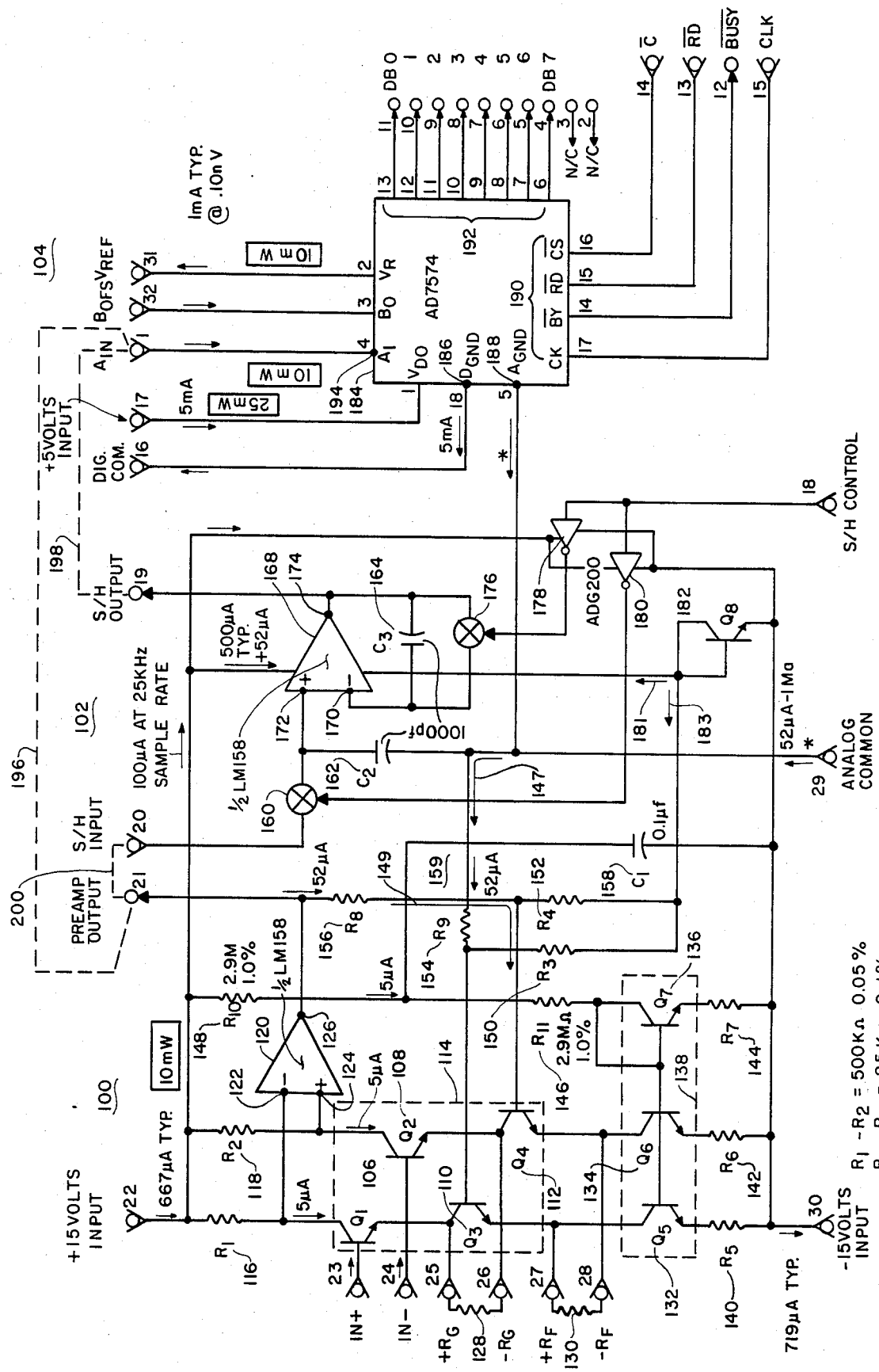

DATA ACQUISITION CHANNEL APPARATUS

RIGHTS OF THE GOVERNMENT

The invention described herein may be manufactured and used by or for the Government of the United States for all governmental purposes without the payment of any royalty.

BACKGROUND OF THE INVENTION

This invention relates to the field of electronic processing circuitry usable with analog data sources, such as light to electrical transducer elements, for amplifying, sampling, remembering, and converting analog input signals into digital output signals.

Present-day electronic hardware for military and commercial use is moving in the direction of decreased analog signal processing and increased digital signal processing, in either software or hardware form, for the analog signals obtained from a variety of signal sources. Generally, the signal source transducers coupled to these digital processors are responsive to varying phenomena according to some prearranged organizational pattern, such as scanning. An example of such signal sources is found in the video signal generating solid state arrays frequently used for scene scanning, large area signal reception, and other light communicated information. In military equipment, it is common practice to process a relatively large number of parallel occurring signals which originate with a terrain scene in order that a representation of the scene be, for example, stored in digital form or presented to a human operator as an array of pixels picture for decision-making purposes.

An additional example of the military use of such apparatus is found in the target drone aircraft used for experimental evaluations in the development of new anti-aircraft weapons systems. In this equipment the employed sensors usually include a plurality of solid state light-to-electrical transducers arranged in a large area physical array and located in reception areas of an unpiloted target aircraft; these sensors are subjected to radiation or varying degrees during a testing flight in order that radiation intensities, duration, frequency spectrum, and other characteristics be quantitatively measurable for use in establishing effectiveness criteria, determining atmospheric effects and measuring other performance factors. In this target aircraft sensor or in the scene scanning example a large number of possibly low level analog signals are received at the input of a data acquisition channel array for processing into digital signals.

Typically these systems further include in the order of 256 analog signals originating in the optical sensor array and having magnitudes as low as the nanoamp range that are to be processed under conditions of limited, battery-supplied processing energy and coupled to a common 8-bit data bus for transmission to a computer digital processing system. Moreover, the parallel nature of the 256 or more transducer input signals and the serial nature of computer-oriented processing, suggests a need for temporary signal storage at some point in the processing system. The present invention, therefore, includes capability for performing signal storage as well as amplification, and conversion of analog signals to digital signals.

The prior patent art includes several examples of signal processing arrangements of the general type described. Notable among these examples is the patent of Gyorgy I. Vancsa, U.S. Pat. No. 4,380,757, which relates to a data acquisition system having a plurality of parallel input channels communicated with a central processor by way of an analog-to-digital converter and a multiplexing communications bus arrangement. This communication arrangement is especially configured to lessen the calibration requirements on the large number of measurement channel circuits employed in the Vancsa apparatus. The Vancsa invention contemplates the use of sample signals, transformer AC coupling and a sample signal calibration method for operating the data channel apparatus.

The patent of Raymond B. Patterson, III, U.S. Pat. No. 4,282,515, discloses an analog-to-digital converter apparatus of the successive approximation type which employs a new encoder arrangement. The Patterson invention also includes sample and hold apparatus which operates in a multi-part cycle, allowing dual use of an incorporated amplifier circuit.

Another data collection system is shown in the patent of Richard A. Mazur et al, U.S. Pat. No. 4,125,831, which discloses a system for monitoring analog signals such as the output of a thermocouple temperature measuring probe. In the Mazur patent, the disclosed circuitry is energy supplied from a battery and is mounted in a moving container on a conveyer system. The Mazur apparatus also contemplates the temporary storage and transmission upon demand of the digital signals representing input data samples. The essence of the Mazur invention concerns the monitoring of temperature of a food can container as it passes through a complex path heating oven. This monitoring includes analog temperature sensing, data storage, and data retrieval upon demand at a predetermined conveyor location.

Another example of a prior art data acquisition apparatus is found in the patent of Jesse B. Lipcon, U.S. Pat. No. 3,982,241, which discloses an analog-to-digital conversion system wherein a single amplifier is shared between an analog-to-digital converter circuit and a sample and hold circuit in order that offset errors generated in one circuit cancel with the errors generated by the other circuit. The Lipcon apparatus includes amplifier circuitry, sample and hold circuitry, analog-to-digital converter circuitry, and the cancellation of spurious signals through a time-shared use of system components involved in spurious signal generation.

Another example of a data input channel apparatus is found in the patent of Andre Edourd Joseph Chatelon, U.S. Pat. No. 3,732,376, which concerns a time division multiplex apparatus employing a pair of sample and hold circuits and disclosing an arrangement for assigning certain of the input channels for use in the transmission of signalling and synchronizing data.

Although each of these prior art patents concerns a data input channel or portions thereof, none of these prior art arrangements is a suitable alternative for the improved capability data acquisition channel apparatus of the present invention.

SUMMARY OF THE INVENTION

An object of the present invention is to provide a data acquisition apparatus capable of operating with low energy requirements.

Another object of the invention is to provide a data acquisition channel apparatus which is capable of fabrication using hybrid integrated circuit techniques.

Another object of the invention is to provide a data acquisition apparatus which is capable of functional flexibility in meeting varying system needs.

Another object of the invention is to provide a data acquisition amplifier circuit providing separate control of the utilized feedback and gain characteristics.

Another object of the invention is to provide a data acquisition channel apparatus which is suitable for use with a large number of data sources that are coupled to a common data bus.

A further object of the invention is to provide a data acquisition apparatus employing a first operational amplifier that is fed from a first and second bipolar preamplifier transistors and with first and second feedback coupling transistors. These transistors use a first signal gain determining impedance member connected differentially with the preamplifier transistors and a second feedback gain determining impedance member connected differentially with the feedback coupling transistors. The acquisition apparatus also includes a source of temperature-dependent bias signal coupled with the feedback coupling transistors and with a second operational amplifier sample and hold circuit, a first storage capacitor and first electronic switch connected with the sample and hold operational amplifier and a second electronic switch and second storage capacitor connected also with the sample and hold operational amplifier, and a driver circuit for controlling operation of the electronic switches. The apparatus also includes an integrated circuit analog-to-digital converter circuit connecting to a common digital data bus.

BRIEF DESCRIPTION OF THE DRAWING

The drawing shows an electrical schematic diagram for the preferred embodiment data acquisition channel apparatus.

DETAILED DESCRIPTION

The accompanying drawing shows an electrical schematic diagram of a single channel differential input data acquisition channel apparatus which generally includes three circuit areas, an amplifier circuit 100, a sample and hold circuit 102, and an analog-to-digital converter circuit 104. Within the amplifier circuit 100, there is included an operational amplifier 120, an array of preamplifier transistors 114, a current source transistor array 138, and a resistor network 159.

Before describing the circuits shown in the drawing in detail, it is desirable to note that the thirty-two circuit terminal numbers located around the periphery of the drawing figure, will be used as reference numbers in the following description, these numbers are actually, in a working embodiment of the invention, the pin members of a hybrid integrated circuit package. These outer periphery numbers are also distinguished from the numbers between 1 and 18 located adjacent the analog-to-digital converter circuit 184 in the drawing which are pin numbers of the analog-to-digital converter package.

Certain of the components shown in the drawing are items of standard electronic hardware which may be obtained from a variety of suppliers known in the electronic art; the standard hardware items include: the operational amplifier circuits 120 and 168, the commonly mounted transistor arrays 114 and 138, the digital driving circuits 178 and 180, and the analog-to-digital converter circuit 184. The operational amplifiers 120 and 168 may be of the commercial LM158 type, the transistor arrays 114 and 138 may be commercial 2N5089, NPN junction transistors mounted on common substrate chips, the digital driving circuits 178 and 180 may be of the commercial ADG200 type, while the analog-to-digital converter 184 may be of the AD7574 type. The capacitor and resistor components shown in the drawing schematic diagram are also common hardware items available from numerous electronic suppliers.

The transistor array 114 together with the resistors 116 and 118, and the current source transistor array 138 comprise a differential preamplifier and feedback coupling amplifier which supplement the capability of the operational amplifier 120 to provide several circuit improvements including, for example, enhanced common mode signal rejection, lower input signal current, separation of the signal gain and feedback quantity determinations, low thermal source noise generation, improved amplifier temperature stability, lower ground bus noise susceptibility, and other capabilities not available in a normal connection of the operational amplifier 120.

Considering now the arrangement by which these improvements are obtained and the functional operation of the amplifier 100 in the drawing depicted apparatus; the quiescent current level in the preamplifier transistor array 114 is established by the voltage applied to the base terminals of the transistors 132 and 134 in the current source array 138, together with the magnitude of the current source transistor emitter resistors 140 and 142. This base terminal voltage is in turn determined by the voltage drop across the resistor 144 and the diode connected transistor 136. These voltage drops are determined by current flow in the resistor 144 and the resistors 146 and 148, and of course, the power supply levels applied at terminals 22 and 30. The same chip close thermal association of the transistors 132, 134 and 136 in the array 138 allows thermal variations in the transistors 132 and 134 to be compensated or offset by similar variations in the transistor 136, thereby tending to maintain the current levels provided by the transistors 132 and 134 at temperature-independent magnitudes.

The differential nature of the preamplifier transistor array 114 and the input nodes 122 and 124 of the operational amplifier circuit cause the output of the operational amplifier 120 to respond only to signal differences appering between the transistors 106 and 108 and to be non-responsive to common mode signals, that is, signals applied to both the transistors 106 and 108. This differential response extends also to the gain determining terminals 25 and 26, where the differential gain of the transistor pair 106 and 108 is determined by the impedance connected between their emitter terminals, that is, by the resistance 128. In similar fashion, the gain of the feedback coupling transistor pair 110 and 112, is determined by the impedance connected at the terminals 27 and 28, the resistance 130.

Negative feedback from the output of the operational amplifier 120 to the preamplifier transistor array 114 occurs along the path 149. The gain of this path, which is part of a feedback loop, is determined by the resistor divider network 159 including the dividing resistors 156 and 152, together with the resistance 130 which determines the voltage gain of the transistor pair 110 and 112. The dividing resistors 156 and 152 have counterparts in the resistors 150 and 154 which serve as a corresponding divider at the other differential input of the feedback coupling transistor pair 110 and 112.

It is notable that the resistor 130 is principally effective as an emitter-to-emitter coupling path for the transistors 110 and 112, and has little effect of the operation of the transistors 132 and 134, since the collector output terminal of these transistors has the characteristic of a current source. A similar statement is applicable to the resistor 128 which is principally effective as an emitter-to-emitter coupling path for the transistors 106 and 108, and has a little effect on the current source collector circuit output of the transistors 110 and 112.

Viewed from a different perspective, the gain determination for a signal fed back along the path 149 is determined by the resistor 130 and is independent of the gain for an input signal applied at the terminals 23 and 24. Input signal gain in the illustrated circuit arrangement is determined by the resistor 128, which in the manner described above has little effect on the current source output characteristics of the transistors 110 and 112. The overall voltage gain of the amplifier stage 100 between the input terminals 23 and 24 and the output at terminal 21 is of course determined by both the feedback gain and the signal gain as determined by the resistors 130 and 128, respectively. This gain can be predicted mathematically using the equation $$V_{out}/(V_{23}-V_{24}) = R_f/R_G(R_8+R_4)/R_4$$

where $V_{out}$ is the signal at terminal 21, the operational amplifier output 126; $V_{23}$ and $V_{24}$ are the voltages applied at terminals 23 and 24; $R_f$ and $R_G$ are the values of the resistors 130 and 128, respectively; and $R_8$ and $R_4$ are the values of the feedback divider resistors 156 and 152.

The use of close tolerance resistor values in embodying the invention as is shown in the drawing is desirable for several reasons, including the achievment of good common mode rejection, a result of close tolerance values for the resistors 116, 118, 140 and 142 and also the two dividers in the network 159, while the close tolerance for the resistors 156 and 152 assures an accurate voltage gain determination for the amplifier 100. The selected values for the resistors 156 and 152 provide a voltage gain of 10, assuming the resistors 128 and 130 are of equal value. Voltage gains larger than this value of 10 may be obtained for use of the data acquisition channel apparatus with transducers having low signal output by changing the value ratio of the resistors 128 and 130.

The use of an analog common node as indicated at terminal 29 in the drawing and the separation of this analog common from a digital common as indicated at terminal 16 in the drawing provides decreased noise coupling into the data acquisition channel apparatus since the analog common node at terminal 29 can be connected to a point referenced to the input signal source while the digital common at terminal 16 may be referred to some higher-level or noisy digital ground bus. The analog common is shown to be used for the analog signals in the amplifier 100, the sample and hold circuit 102, and the analog portion of the analog-to-digital converter 104.

The presence of closed-loop negative feedback around the path 149 and including the preamplifier transistor array 114 and the operational amplifier 120 is to be noted. As indicated by the drawing, this feedback is accomplished without frequency rolloff or other compensating techniques often found necessary to prevent dynamic instability or oscillation in a closed-loop amplifier circuit, this is another advantage of the illustrated arrangement of the preamplifier transistor array 114 and the operational amplifier 120.

The resistors 150, 152 are shown connected to the collector and base terminals of the diode connected transistor 182 in order that a small amount of temperature-responsive voltage appear in the signals transmitted along the feedback paths 147 and 149, this temperature-dependent voltage is supplied along the path 183 and additionally supplied to the negative power supply terminal of the sample and hold operational amplifier 168 along the path 181. The capacitor 158 in the drawing serves as a filter for removing noise or other undesired signals from the current established in the resistor 144 and the transistor 136.

The quiescent current levels and the energy dissipation rate for several points in the preferred embodiment of the invention are shown in the drawing; typically these power requirements total to an operating quiescent requirement near 65.8 milliwatts for one data acquisition channel apparatus, or a total of about 18 watts of dissipation for a 256-channel arrangement of the apparatus. Low energy requirements and the potential for battery operation of a large number of the illustrated acquisition channel apparatus is a desirable feature of the invention, as indicated previously.

The low energy requirement is another benefit of the preamplifier transistor array 114, the illustrated bipolar transistor array is preferable to the commonly employed field effect input transistor array because of the lower quiescent current levels, on the order of 5 microamperes, indicated in the drawing that are acceptable in such a bipolar preamplifier stage. This quiescent current is, in comparison with the 50 to 100 microampere quiescent currents required by an alternative field effect preamplifier stage.

Depending upon the time characteristics of the signal applied at terminals 23 and 24, the output of the amplifier stage 100 may be applied to either the sample and hold circuitry 102 as indicated by the dotted line connection 200; or alternately, in the instance of a slowly varying or substantially constant valued input signal at the terminals 23 and 24, the output of the amplifier stage 100 may be suitable for direct connection to the analog-to-digital converter circuit 104, indicated by the connection 196. Let it be assumed for the moment that a rapidly fluctuating input signal is present together with a suitable sample compound so that the connection indicated at 200 together with use of the sample and hold circuit 102 is appropriate along with an operating description of the sample and hold circuit.

The illustrated sample and hold circuit employs a pair of storage capacitors 162 and 164, an operational amplifier 168, and a pair of electronic switches 160 and 176 to store a voltage representing an instantaneous value of the amplifier output signal in response to a sampling command received at terminal 18. The sample and hold circuit second storage capacitor 164 is connected between the output and the negative input of the operational amplifier 168 and is shunted by the electronic switch 176. The electronic switches 160 and 176 are preferably embodied in the form of field effect transistors, such devices provide resistive connection between input and output (source and drain) terminals without the presence of an offset voltage and with only small capacitance coupled switching error. Use of the two capacitors 162 and 164 allows this small amount of error introduced by gate to drain or gate to source capacitance coupling in the electronic switch field effect transistors 160 and 176 to be compensated since the error introduced in the signal stored on the capacitor 162 is offset by a similar error in the signal stored on the capacitor 164. These two error signals appear at oppositely poled input nodes 170 and 172 of the operational amplifier 168 in the illustrated circuit arrangement. The digital driving circuits 178 and 180 provide suitable amplitude control signals for operating the electronic switch field effect transistor devices 160 and 176. In the illustrated arrangement of the sample and hold circuit, discharge of the holding capacitor 162 is accomplished by way of new signal current flow in the electronic switch 160 when a new signal is to be stored while discharge of the capacitor 164 may be accomplished by current flow in the switch transistor 176.

The output of the operational amplifier 168 appearing at the node 174 is connected to terminal 19 for coupling to the analog input of the analog-to-digital converter circuit 184 by way of the connection 198. The connection 198 is employed in lieu of the connection 196 in input signal instances when the sample and hold circuit 102 is utilized.

Operation of the analog-to-digital circuit 184 is described in the manufacture's literature concerning such converters and is also well known in the electronic art. This operation results in the generation of coded binary signals at the output port 192 following a brief period of searching for a value matching the analog input signal. These binary signals are suitable for common bussing with a plurality of similar circuits by way of the open driver nature of the A/D converter output stage wherein the output driver is capable of driving to either of bwo binary signal levels or of being in an open circuit non-bus driving condition. The control signals at the port 190 provide two-way communication between the analog-to-digital converter and a digital data receiving apparatus to accomplish the input and output of data signals and release of the common data bus as is known in the art. Typical power requirements for the analog-to-digital converter circuit are shown in the drawing, these power requirements are also compatible with the low energy requirement of the preferred embodiment apparatus.

Concerning terminology used in describing the apparatus shown in the drawing, it should be understood that the term "connected with" is intended to be generic to the more specific terms "connected to" and "connected indirectly to". This terminology might be used, for example, in the case of the transistors 108, 112 and 134, where it could be stated that the transistor 108 is "connected with" the transistor 134, such connection being in actuality achieved by way of the intervening transistor 112. The term operational amplifier as used herein will also be understood to a person skilled in the electronic art; such amplifiers have origin in the analog computer art where because of large feedback ratios their input and output signals are precisely related and therefore usable for computation purposes. Operational amplifiers are now available in small integrated circuit transistorized form for use in applications such as the present apparatus not directly relating to an analog computer. The positive and negative input nodes as shown for the amplifiers 120 and 168 together with some form of feedback between output and input ports is an attribute of operational amplifiers.

The components shown in the drawing for the preferred embodiment of the invention lend readily to hybrid integrated circuit fabrication that is, to the incorporation of a plurality of monolithic integrated circuit chips within a single package of one square inch or less in area. Small fabrication of this size in turn lends well to the airborne space and weight allocations available for the preferred embodiment apparatus. Additionally the low power dissipation and small response to temperature changes in the preferred embodiment apparatus also relate well to the intended airborne use of the preferred embodiment apparatus. Three power supplies, +15 volts, −15 volts, and +5 volts are shown to be employed in the preferred embodiment apparatus. One or more of these power supplies could be eliminated with changes to the illustrated apparatus and the incorporation of other integrated circuit components available in the electronic component marketplace.

A desirable algorithm for setting the gain of the amplifier in order to achieve full capability operation of the analog-to-digital converter circuit is to fix the resistor 128 at a value equal to the analog-to-digital converter full scale input signal divided by 1.0 microampere, then choose the value of the resistor 130 to equal the value of the resistor 128 multiplied by the ratio of 1.0 volts to the analog-to-digital converter full scale input signal value.

While the apparatus and method herein described constitute a preferred embodiment of the invention, it is to be understood that the invention is not limited to this precise form of apparatus or method, and that changes may be made therein without departing from the scope of the invention, which is defined in the appended claims.

We claim:

1. Data input channel signal amplifier apparatus comprising:
   an integrated circuit operational amplifier circuit having positive and negative input terminals and a unitary output terminal;
   first and second co-mounted bipolar signal preamplifier transistors having base terminals connected to the positive and negative terminals of an input channel differential signal receiving port, collector terminals connected to said negative and positive operational amplifier circuit input terminals respectively and having emitter terminals connected together through a differential signal gain determining impedance member, said emitter terminals being also connected with a pair of co-mounted current source transistors;
   first and second co-mounted bipolar negative feedback coupling transistors connected between said preamplifier transistors and said co-mounted current source transistors and having collector terminals connected to said preamplifier transistor emitter terminals, emitter terminals connected together through a differential feedback gain determining impedance member and connected also to said co-mounted current source transistors, and having base terminals connected with a zero signal reference node and with said operational amplifier output node respectively through resistor divider networks; and
   a source of temperature modulated bias signal coupled with said first and second negative feedback transistor base terminals by way of said resistor divider networks.

2. The apparatus of claim 1 wherein said transistors are NPN junction transistors arranged to operate with quiescent collector currents of five microamperes.

3. The apparatus of claim 2 wherein said gain determining impedance members are resistors.

4. The apparatus of claim 3 further including a source of temperature-responsive bias signal coupled with the base terminals of said first and second feedback coupling transistors.

5. Low energy hybrid integrated circuit data acquisition apparatus for processing an analog data signal comprising the combination of:
   a first integrated circuit operational amplifier circuit having positive and negative input terminals and a unitary output terminal;
   first and second bipolar preamplifier transistors having base terminals connected to positive and negative data input terminals and collector terminals connected to said negative and positive first operational amplifier circuit input terminals respectively and having emitter terminals coupled with a pair of current source circuits;
   first and second bipolar feedback coupling transistors connected intermediate said preamplifier transistors and said current source circuits with collector terminals connected to said preamplifier transistor emitter terminals, emitter terminals connected to said current source circuits, and base terminals connected with an analog signal reference node and said first operational amplifier circuit output terminal respectively;
   a first, signal gain determining, impedance member connected between said preamplifier transistor emitter terminals;
   a second, feedback gain determining, impedance member connected between said feedback coupling transistor emitter terminals;
   a source of temperature dependent bias signal coupled with said base terminals of said feedback coupling transistors;
   a second integrated circuit operational amplifier sample and hold circuit having an output terminal, a first storage capacitor shunted by a first electronic switch and connected between said output and a negative input terminals thereof and having a positive input terminal connectable with said first operational amplifier circuit output terminal;
   a second electronic switch connected intermediate said first operational amplifier output terminal and said second operational amplifier positive input terminal;
   a second storage capacitor connected between said second operational amplifier positive input terminal and said analog reference node;
   driver circuit means for controlling the operation of said first and second electronic switches in response to a sample and discharge control signal; and
   an integrated circuit analog-to-digital converter circuit having an analog signal input terminal connectable with said second operational amplifier output terminal, a plurality of digital data bus connectable digital output terminals, an analog input reference terminal connected with said analog signal reference node and a digital reference terminal connectable with a digital data bus reference node and a plurality of control input terminals.

6. The data acquisition apparatus of claim 1 wherein said second operational amplifier sample and hold circuit further includes a connection with said source of temperature-dependent bias signal.

7. The data acquisition apparatus of claim 6 further including selectable means for connecting said second operational amplifier sample and hold circuit positive input terminal directly to said first operational amplifier circuit output terminal.
   whereby said data acquisition apparatus is capable of response to a slowly-varying signal received at said data input terminals without the functioning of said sample and hold circuit.

8. The data acquisition apparatus of claim 6 wherein said first and second preamplifier transistors and said first and second feedback coupling transistors each comprise characteristically matched pairs of transistors and further including means for maintaining the transistors in said pairs at the same temperature.

9. The data acquisition apparatus of claim 8 wherein said first and second electronic switches are comprised of field effect transistors.

10. The data acquisition apparatus of claim 9 wherein said data bus connectable digital output terminals of said analog-to-digital converter include the capability for attaining two binary output signal levels and an open circuit condition.

11. The data acquisition apparatus of claim 10 wherein said pair of current source circuits include first and second bipolar transistors of similar electrical and physical characteristics and similar temperature environment and wherein the base terminals of said transistors is connected to a temperature-responsive potential source.

12. The data acquisition apparatus of claim 11 wherein said temperature-responsive potential source includes a diode connected third bipolar transistor similar in characteristics and physical location to said first and second current source bipolar transistors.

13. The data acquisition of claim 12 wherein said first and second capacitors are equal in electrical size.

14. The data acquisition apparatus of claim 13 wherein said connection of said first and second feedback coupling transistors with said analog signal reference node and with said first operational amplifier circuit output terminal each include resistor dividing networks and wherein said resistor dividing networks have equal dividing ratios.

* * * * *